United States Patent [19]

Rust

[11] Patent Number: 5,901,251
[45] Date of Patent: May 4, 1999

[54] ARITHMETIC CODING COMPRESSOR USING A CONTEXT MODEL THAT IS ADAPTIVE TO VARIABLE LENGTH PATTERNS IN BI-LEVEL IMAGE DATA

[75] Inventor: Robert A. Rust, Boise, Id.

[73] Assignee: Hewlett-Packard Company, Palo Alto, Calif.

[21] Appl. No.: 08/820,198

[22] Filed: Mar. 18, 1997

[51] Int. Cl.⁶ .................................................. G06K 9/36
[52] U.S. Cl. .......................................... 382/247; 382/232
[58] Field of Search .................................... 382/247, 229, 382/238, 232, 199, 176, 177, 257, 173; 358/430

[56] References Cited

U.S. PATENT DOCUMENTS 5,131,049  7/1992  Bloomberg et al. ..................... 382/257
5,297,220  3/1994  Nomizu ................................. 382/247

*Primary Examiner*—Jose L. Couso
*Assistant Examiner*—Dmitry Novik
*Attorney, Agent, or Firm*—Anthony J Baca

[57] ABSTRACT

The present invention provides a method for compressing image data. The method first detects a pattern in a first subset of the image data, where the second subset being collocated to a second subset. If no pattern is detected, then a text mode context model is selected. If a pattern is detected, then the period of the pattern is detected and a pattern mode context model is selected. The pattern mode context model has a width directly related to the period of the pattern detected. An arithmetic compressor compresses the second subset using the selected context model.

9 Claims, 8 Drawing Sheets

ARITHMETIC CODING COMPRESSOR USING A CONTEXT MODEL THAT IS ADAPTIVE TO VARIABLE LENGTH PATTERNS IN BI-LEVEL IMAGE DATA

FIELD OF THE INVENTION

The present invention relates to a method and device for arithmetically encoding an image containing halftones and, more particularly, to a context model that is adaptive to variable length patterns in bi-level image data.

BACKGROUND OF THE INVENTION

Data compression systems are known in the prior art that encode a stream of digital data signals into compressed digital code signals and decode the compressed digital code signals back into the original data. Data compression refers to any process that attempts to convert data in a given format into an alternative format requiring less space than the original. The objective of data compression systems is to effect a savings in the amount of storage required to hold or the amount of time required to transmit a given body of digital information.

To be of practical utility, a general purpose digital data compression system should satisfy certain criteria. The system should have reciprocity. In order for a data compression system to possess the property of reciprocity it must be possible to re-expand or decode the compressed data back into its original form without any alteration or loss of information. The decoded and original data must be identical and indistinguishable with respect to each other. The property of reciprocity is synonymous to that of strict noiselessness used in information theory. Some applications do not require strict adherence to the property of reciprocity. One such application in particular is when dealing with graphical data. Because the human eye is not that sensitive to noise, some alteration or loss of information during the compression de-compression process is acceptable.

The system should provide sufficient performance with respect to the data rates provided by and accepted by the devices with which the data compression and de-compression systems are communicating. The rate at which data can be compressed is determined by the input data processing rate into the compression system, typically in millions of bytes per second (megabytes/sec). Sufficient performance is necessary to maintain the data rates achieved in present day disk, tape and communication systems which rates typically exceed one megabyte/sec. Thus, the data compression and decompression system must have enough data bandwidth so as to not adversely affect the overall system. The performance of data compression and decompression systems is typically limited by the computations necessary to compress and de-compress and the speed of the system components such as, random access memory (RAM), and the like, utilized to store statistical data and guide the compression and de-compression process. Performance for a compression device is characterized by the number of processor cycles required per input character under the compressor. The fewer the number of cycles, the higher the performance.

Another important criteria in the design of data compression and de-compression systems is compression effectiveness, which is characterized by the compression ratio. The compression ratio is the ratio of data size in uncompressed form divided by the size in compressed form. In order for data to be compressible, the data must contain redundancy. Compression effectiveness is determined by how effectively the compression procedure uses the redundancy in the input data. In typical computer stored data, redundancy occurs both in the nonuniform usage of individual symbology, example digits, bytes, or characters, and in frequent recurrence of symbol sequences, such as common words, blank record fields and the like.

General purpose data compression procedures are also known in the prior art, three relevant procedures being the Huffman method, the Tunstall method and the Lempel-Ziv method. The Huffman method is widely known and used, reference thereto in article of D. A. Huffman entitled "A Method For Construction Of Minimum Redundancy Codes", Proceedings IRE, 40, 10 pages 1098–1100 (September 1952). Reference to the Tunstall algorithm may be found in Doctoral thesis of B. P. Tunstall entitled "Synthesis of Noiseless Compression Codes", Georgia Institute of Technology (September 1967). Reference may be had to the Lempel-Ziv procedure in a paper authored by J. Ziv and A. Lempel entitled "A Universal Algorithm For Sequential Data Compression", IEEE Transactions on Information Theory, IT-23, 3, pages 337–343 (May, 1977).

One of the first general purpose data compression procedures developed is the Huffman method. Briefly described, the Huffman procedure maps full length segments of symbols into variable length words. The Huffman data compression procedure suffers from two limitations. Firstly, the Huffman procedure operates under the constraint that the input data to be compressed be parsed into fixed length segments of symbols. Although the Huffman procedure provides the best compression ratio that can be obtained under these constraints, when the constraint is relaxed it is possible to obtain significantly better compression ratios by utilizing other procedures. Secondly, Huffman coding requires full knowledge of the statistical characteristic of the source data. The Huffman procedure operates under the assumption that the probability with which each fixed length input segment occurs is known. This requirement of the Huffman procedure can in practice, be satisfied by the use of an adaptive version of the procedure which accumulates the necessary statistics during processing of the data. This, however, is cumbersome, and requires considerable working memory space and performs sub-optimally during adaptation.

The Tunstall algorithm, which maps variable length segments of symbols into fixed length binary words, is complimentary to the Huffman procedure with the fixed length constraints now applied to the output segments instead of the input segments. Like the Huffman procedure, the Tunstall procedure requires a foreknowledge of the source data probabilities. Again this foreknowledge requirement can be satisfied to some degree by utilizing an adaptive version which accumulates the statistics during processing of the data.

The Lempel-Ziv procedure maps variable length segments of the symbols into variable length binary words. It is asymptotically optimal when there are no constraints on the input or output segments. In this procedure the input data string is parsed into adaptively grown segments, each segment consisting of an exact copy of an earlier portion of the input string suffixed by one new symbol from the input data. The copy which is to be made is the longest possible and is not constrained to coincide with any earlier parsed segment. The code word which replaces the segment in the output contains information consisting of a pointer to where the earlier copied portion begins, the length of the copy, and the new symbol.

It would appear that Huffman or Shannon-Fano coding is the perfect means of compressing data. However, this is not the case. As mentioned above, these coding methods are optimal when and only when the symbol probabilities are integral powers of ½, which is usually not the case.

The technique of arithmetic coding does not have this restriction: It achieves the same effect as treating the message as one single unit (a technique which would, for Huffman coding, require enumeration of every single possible message), and thus attains the theoretical entropy bound to compression efficiency for any source.

In arithmetic coding, one decision after another is encoded to define successively smaller, lesser included intervals along a number line. Additional information on arithmetic coding can be found in "An Introduction To Arithmetic Encoding"; by G. G. Langdon, Jr., IBM Journal of Research and Development, Vol. 28, n. Mar. 2, 1984, 135–149; and "Arithmetic Compression Code Control Parameters Approximation"; by D. R. Helman, G. G. Langdon, Jr., and J. J. Rissanen, Vol. 23, n. Apr. 11, 1981, 5112–5114 and U.S. Pat. No. 4,905,297, "Arithmetic Coding Encoder And Decoder System", Langdon, Jr. et al. all incorporated herein by reference.

As noted in the above articles, arithmetic coding provides that each decision has a plurality of possible exclusive outcomes "or events". Each outcome or event is represented in data by a symbol. In the imaging environment, for example, each decision may correspond to whether or not a given pixel is black. The decision outcome being represented by a Y (or YES) symbol if the pixel is black or an N (or NO) symbol if the pixel is not black. Thus, a plurality of decisions may then be represented by a sequence of symbols, e.g., YNNY . . .

In accordance with prior arithmetic coding teachings, a probability line has a current interval defined thereon. The first current interval is 0 to 1. The current interval is divided into segments in which segment corresponds to one possible outcome for the next decision. Where there are only two possible outcomes for each decision, the current interval is divided into two segments. The length of each segment is based on its respective associated probability. The respective probabilities may remain fixed or may adapt as decision data is entered.

It is the correlating of large segments to symbols which occur with greater frequency that leads to the compression effect. In the former cited article ("An Introduction To Arithmetic Encoding"), a 4-symbol arithmetic coding example is set forth in which each decision can result in an "a" event (having a 50% probability), a "b" event (having a 25% probability), a "c" event (having a 12.5% probability), or a "d" event (having a 12.5% probability). Representing the four events in binary form would require two bits for each decision, where the events would be represented respectively by 00, 01, 10, 11. For three decisions such as "aab" which is highly likely, the straight forward encoding data would be 00 00 01; requiring six bits. However, as observed in the article at page 137, the arithmetic coding approach permits the sequence "aab" to be represented by the value 0.001. Instead of six bits, the information can be represented in three bits. This conservation of bits results as successive events having relatively high associated probabilities occur.

The conservation deteriorates if numerous events occur for which there are low probabilities and relatively short line segments. With the above noted probabilities, a sequence of events "dd" would be represented with encoded data as 11 11 whereas, by arithmetic coding, the "dd" events would be represented by 111111. Provided that the larger segments in fact correspond to events that occur with correspondingly greater frequency, the additional bits needed for less probable symbols are outweighed by the conservation achieved when more probable symbols occur.

Images containing continuous tone grayscale must be halftoned to print on bi-level printers. Halftoning is generally accomplished by using a two-dimensional matrix of the thresholds commonly referred to as a dither matrix. The grayscale images are binarized by comparing successive pixels of a generated image signal to a corresponding threshold of the dither matrix and generating a binary signal, a dithered signal, in dependence on whether the pixel value of the image signal is greater or smaller than the corresponding threshold in the dither matrix. Thus, for a halftoned image, a single bit is allocated for each pixel in the dithered signal. Because adjacent pixels are binarized in response to different thresholds, the local density of the dithered signal will correspond to the density of the original grayscale image.

In digital halftoning and printing of continuous tone grayscale images, a tradeoff generally exists between the halftone resolutions and the number of gray levels produced. Increasing resolution to obtain greater edge detail causes a reduction in available gray levels, and a corresponding degradation in the depth and smoothness of gray contours. For additional information about digital halftoning see, "Digital Halftoning", Ulichney, R, ISBN 0-262-21009-6 (fourth printing 1993), incorporated herein by reference.

The most direct solution to increasing the halftone resolution and number of gray levels producible, is to increase the printer resolution. For instance, migrating from a 600 dpi to a 1200 dpi printer gives four times the number of available gray levels. However, additional cost of the higher resolution print mechanism and the four times increased bitmap memory requirement is incurred.

To avoid the increased bitmap memory costs by using higher resolution, an image can be halftoned in real time and sent to the printer without intermediate storage in a bitmap memory. However, other non-image elements may be present on a page, such as text and graphics. These may overlay, masks, incur, or otherwise logically operate upon the halftone images and must be stored in memory with them.

Generally, data compression can be applied to a halftone image to reduce bitmap memory requirements, with real time decompressed output sent to the printer. However, prior to the present invention most decompression systems provide relatively low compression ratio for halftone images.

SUMMARY OF THE INVENTION

In order to accomplish the present invention there is provided a method for compressing image data. The method first detects a pattern in a first subset of the image data, where the second subset being collocated to a second subset. If no pattern is detected, then a text mode context model is selected. If a pattern is detected, then the period of the pattern is detected and a pattern mode context model is selected. The pattern mode context model has a width directly related to the period of the pattern detected. An arithmetic compressor compresses the second subset using the selected context model.

A hardware embodiment apparatus for compressing an image data is also presented. The apparatus is constructed from an arithmetic compressor, which includes a probability table, a text mode context model, and a pattern context model. A shift register is also connected to the arithmetic compressor. The shift register receives the image data and sends some of the data to the arithmetic compressor and the pattern detector. The pattern detector, which is connected to the arithmetic compressor, signals the arithmetic compressor to use the text context model when a pattern is not detected in the image data or the pattern context model when a pattern is detected.

BRIEF DESCRIPTION OF THE DRAWINGS

A better understanding of the invention may be had from the consideration of the following detailed description taken in conjunction with the accompanying drawings in which.

DETAILED DESCRIPTION OF THE PREFERRED EMBODIMENTS

The present invention is not limited to a specific embodiment illustrated herein. The present invention adapts to various length patterns to create an index into the probability table that yields meaningful statistics regarding the value of the bit to encode/decode. As part of the invention there is a mechanism to detect patterns and the pattern's period. If no patterns are detected, then the arithmetic code compressor uses a context model optimized for line art and text. When a pattern is detected, the arithmetic code compressor uses a context that is optimized for dithered images.

Context models for arithmetic code compressors develop their index into a probability table by looking at bits of data surrounding the bit being compressed. The important aspect to the indexing is the addressed location contains useful information concerning the value of the bit to be encoded/decoded. More specifically, the bits used to index the probability table should be able to provide significant information so that a reliable prediction of the bit to be encoded/decoded can be made. The more reliable the prediction, the better the compressibility of the image. In text and line art images, the bits close (301 and 302) to the bit 101 to be encoded/decoded provide the most useful information regarding that bit's value. Thus, for a text or line art image the context model of FIG. 3 will generally produce the highest data compression.

Images with gray shading may be converted to bi-level data before being sent to a printer. The most common method of halftoning uses a dither matrix as known in the art. A dither matrix process creates patterns in the bilevel data which are used to produce an effective level of gray. The pattern may have any length period in it, so the information about the pattern is not available to the printer and thus not available to a compressor in the printer.

Figure 1:
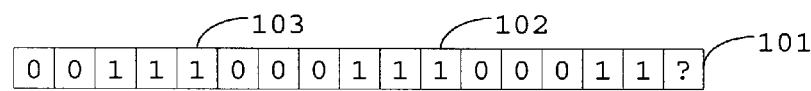
FIG. 1 shows a pattern generated by a halftoning process where the useful information lies away from the bit being compressed.
Figure 2:
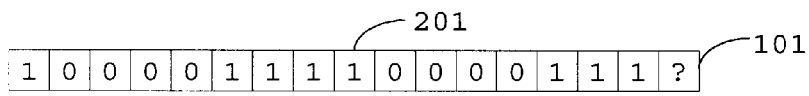
FIG. 2 shows a second pattern generated by a dither process where the useful information lies away from the bit being compressed.

Given an image that has been halftoned, useful information about the probability of a bit to encode actually lies away from the bit. Consider FIG. 1, which shows a bit map with a pattern width of 6. Assuming that the compressor is presently working on pixel 101. Pixel 102, which is one pattern away and pixel 103, which is two pattern widths away provide the most information about the probability of the state of bit 101. In other words, if the value of pixel 102 is known, the chances of guessing the pixel 101's value is much higher. In FIG. 2, the width of the pattern is 8. Pixel 201, which is a distance of 8 away from pixel 101 provides the most information about the probability of the state of pixel 101.

Figure 3:
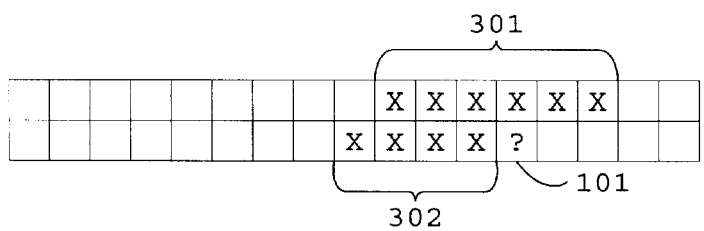
FIG. 3 shows a typical context model used to compress bi-level data.
Figure 4:
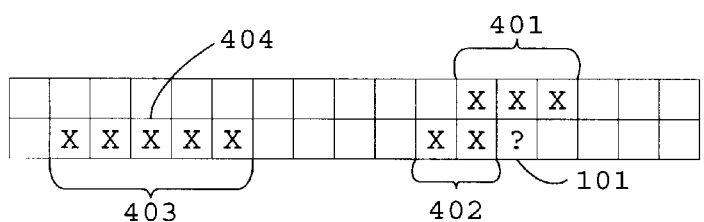
FIG. 4 shows a example of a context model for dither, bi-level data in accordance with the present invention.

For a halftoned image, the context model of FIG. 3 does not produce the best image compression because the bits most related to the bit being compressed are not included. However, the context model of FIG. 4 uses those most influential bit resulting in a more reliable prediction and thus, an better compression ratio. In FIG. 4 the bit being compressed 101 is predicted based upon the bits in groups 401, 402, and 403 where the distance between group 403 and bit 101 is equal to one pattern width.

Because the printer has no foreknowledge about the kind of pattern it is to print or compress, it is important to first recognize the presence of a pattern, then adjust to that pattern appropriately. As an example, the numbers in table 1 refer to the compression ratio—the larger the number the better the compression—obtained for each file. A number of 34.21 refers to a compression ratio of 34.21:1. These files contain various types of data. Some files have scanned image data wherein the patterns are created by halftoning while others are computer generated images which use regular patterns to created different shades of gray. Table 1 gives a comparison of two identical compressors with the only difference being that of pattern detection and the ability to adapt to the variable length patterns. Numbers in the first column were created by an arithmetic code compressor using the context model of FIG. 3. The second column represent compression ratios for an arithmetic code compressor using a context model of FIG. 3 when no pattern was detected and when a pattern is detected, the context model of FIG. 4 is used with the distance between pixels 101 and 404 equal a single pattern width.

TABLE 1

| File | No Pattern Detection | Patterns Detected |
| --- | --- | --- |
| arch_letter | 34.21 | 38.75 |
| duck_shoot | 4.29 | 6.93 |
| golfer | 19.43 | 39.53 |
| grasshopper | 8.48 | 22.76 |
| harley | 19.71 | 24.93 |

TABLE 1-continued

| File | No Pattern Detection | Patterns Detected |
|---|---|---|
| juggle | 13.89 | 32.03 |
| jukebox | 12.91 | 26.06 |
| sparkplug | 7.41 | 20.23 |
| train | 12.33 | 18.21 |
| travel_letter | 10.92 | 15.61 |
| trumpet | 10.26 | 23.00 |

Table 1 shows that the use of pattern detection can greatly increase the compression ratio of some files without degrading the compression ratio of any file.

Figure 5:
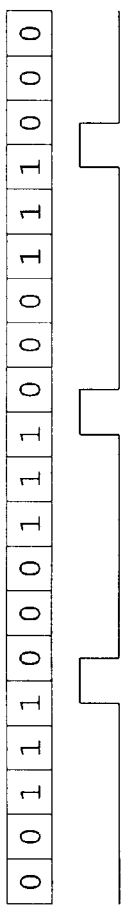
FIG. 5 shows a portion of an image and the edge detection result.

In the preferred embodiment, pattern detection is accomplished by counting the distance between edges formed in the data stream. Referring to FIG. 5, the edges of the pattern are detected by looking at two bits in the data stream. As the data is shifted by, edges in the data are detected. The rate at which the edges are detected is counted. If a consistent edge rate is found, the compressor switches context models and uses the pattern context model. In FIG. 5 a pattern of length 6 would be detected.

Figure 6:
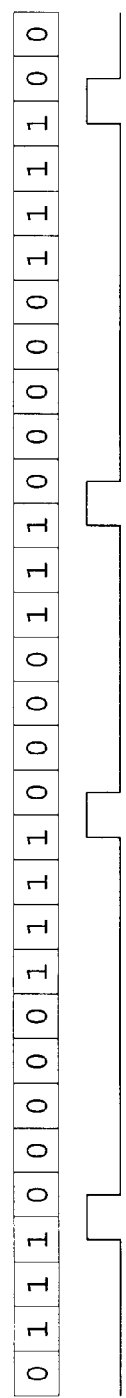
FIG. 6 shows a portion of an image and the edge detection result.

Simply counting the distance between edges may not find a consistent edge rate because edges may come on odd boundaries. For example, a pattern with a period of 8 can have an edge rate of 7, 9, 7, 9, as shown in FIG. 6. The pattern of FIG. 6 is common when the resolution is insufficient to render a specific shade of gray. The preferred embodiment of the present invention handles that case by averaging the previous two edge rates. Averaging forms a consistent pattern width calculation across the pattern.

With that high level description of the preferred embodiment, a more detailed description will follow. First, a software implementation is presented followed by a description of a hardware implementation.

Figure 9:
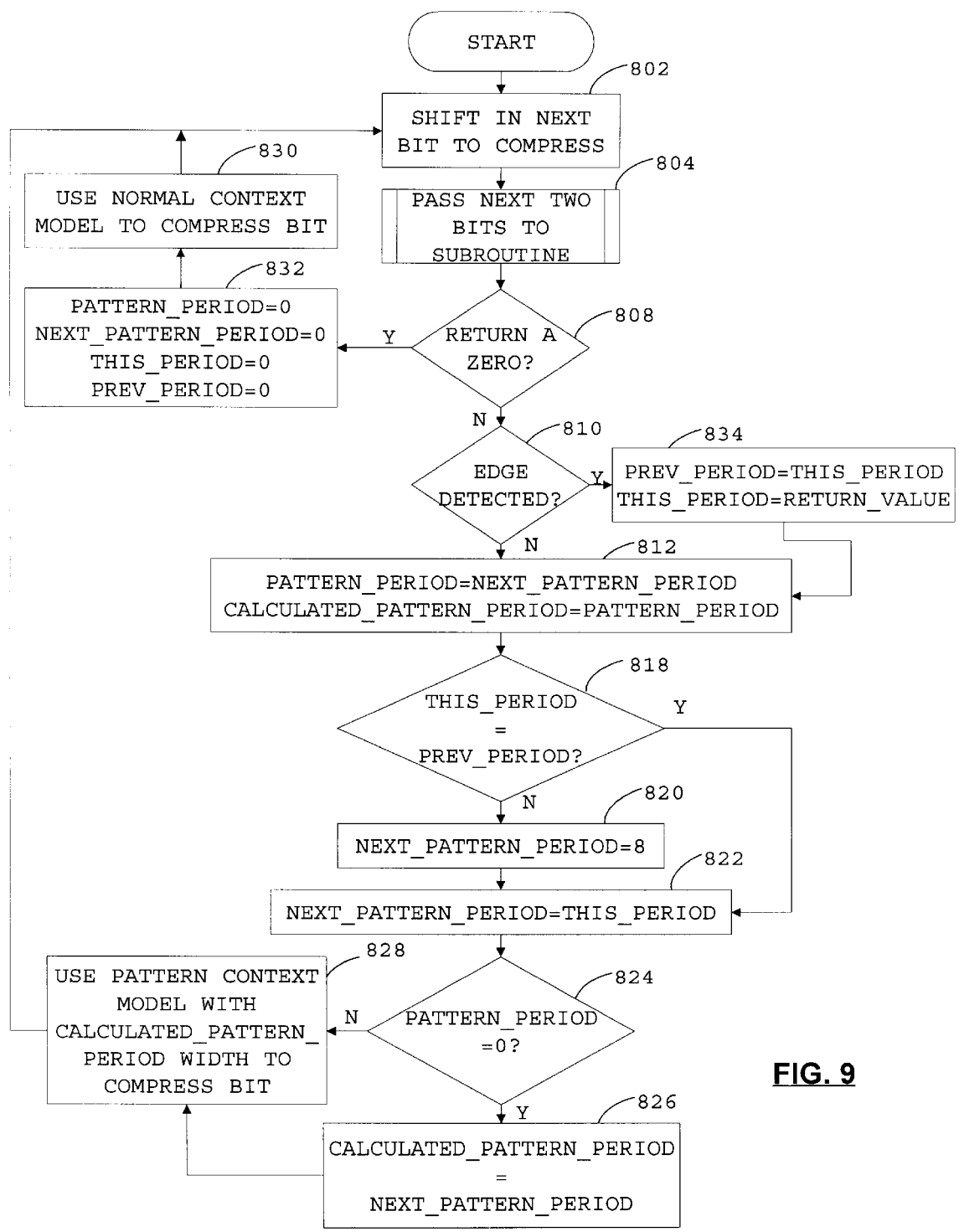
FIG. 9 is a flow diagram showing the logical operation of preferred embodiment in accordance with the present invention.

The flow chart of FIG. 9 shows the logical operation used to detect the presence of a pattern. As part of the initialization of the compressor, several variables are set to zero. These variables include, for example, PATTERN_PERIOD, PREV_PERIOD, THIS_PATTERN, and NEXT_PATTERN_PERIOD.

A compression cycle starts by shifting in a bit to be compressed 802 into the compressor. Before the bit can be compressed, a determination about which context model to use must be made. The next two bits are used to determine if the bit being compressed is in a pattern. These two bits are passed 804 to a subroutine as described in FIG. 10 below. The pattern detection subroutine of FIG. 10 determines if the bit being compressed is part of a pattern along with an indication whether the two bits form an edge. The pattern detection subroutine returns a zero 804 if the present bit is not in a pattern. Thus, if a zero is returned 808 then PATTERN_PERIOD, NEXT_PATTERN_PERIOD, THIS_PATTERN, and PREV_PERIOD are all set to zero 832 and the normal context model, FIGS. 3 or 7 for example, is used to compress the bit 830.

Figure 8:
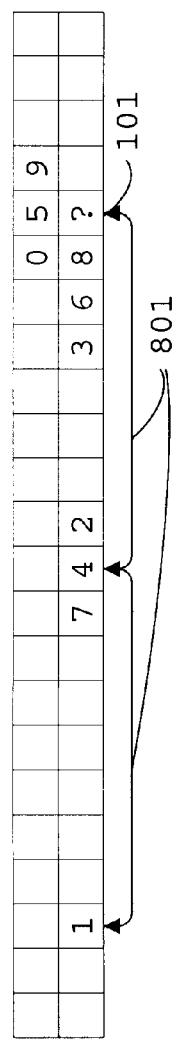
FIG. 8 shows the context model for dither, bi-level data in accordance with the present invention.

If the pattern detection subroutine returns other than a zero 808, then the bit being compressed is in a pattern, thus the pattern context model of FIGS. 4 or 8 is used. The remainder of the steps in FIG. 9 determines what value (PATTERN_PERIOD) to use as the period (801 in FIG. 8) for the pattern context model. The process attempts to quickly adjust the period to a value that gives the most data compression. Thus, when the start of a pattern is detected, the length of the period is preset to an empirical value of eight 820. Eight directly correlates to the most common dither cell size used by the printer on which the preferred embodiment was tested. Other systems with different dither cell sizes may require a different preset value. The present invention also contemplates that given the printer's command interface, that pattern width used to halftone could be downloaded to the printer. This down loaded value would then be used as the empirical value. As the compressor moves through the pattern, PATTERN_PERIOD converges on the actual size of the pattern; the preset value of eight, which may be thought of as a seed value, serves to hasten the convergence.

Briefly referring to FIGS. 5 and 6, the preferred embodiment defines an edge as a transition from a 1 to a 0. Thus, if the two bits sent to the pattern detection subroutine 804 are "10" then an edge is detected. For those instances where the bit is in a pattern and an edge is detected 810, both PREV_PERIOD and THIS_PERIOD are updated 834. In particular, PREV_PERIOD is set to the present value of THIS_PERIOD and THIS_PERIOD is set to the value computed by the pattern detection subroutine. The first time a pattern is detected, PREV_PERIOD=0 and THIS_PERIOD will have some value equal to the pattern period detected in the pattern subroutine 804.

Next, PATTERN_PERIOD is set equal to NEXT_PATTERN_PERIOD and CALCULATED_PATTERN_PERIOD is set equal to PATTERN_PERIOD 812. Again, assuming that this is the first time a pattern is detected, both PATTERN_PERIOD and NEXT_PATTERN_PERIOD are zero. Thus, THIS_PERIOD does not equal PREV_PERIOD 818. This indicates that the start of a pattern has been detected. As stated above, to speed the convergence, NEXT_PATTERN_PERIOD is set to the seed value of eight (8) 820. Assuming that the next bit is part of a pattern, then step 820 is bypassed because THIS_PERIOD will equal PREV_PERIOD. The variable NEXT_PATTERN_PERIOD is set to THIS_PERIOD 822. If PATTERN_PERIOD is equal to zero 824, then CALCULATED_PATTERN_PERIOD is set to equal NEXT_PATTERN_PERIOD 826. Finally, the bit is compressed using the pattern context model of FIG. 8 with a period of CALCULATED_PATTERN_PERIOD 828.

Figure 10A:
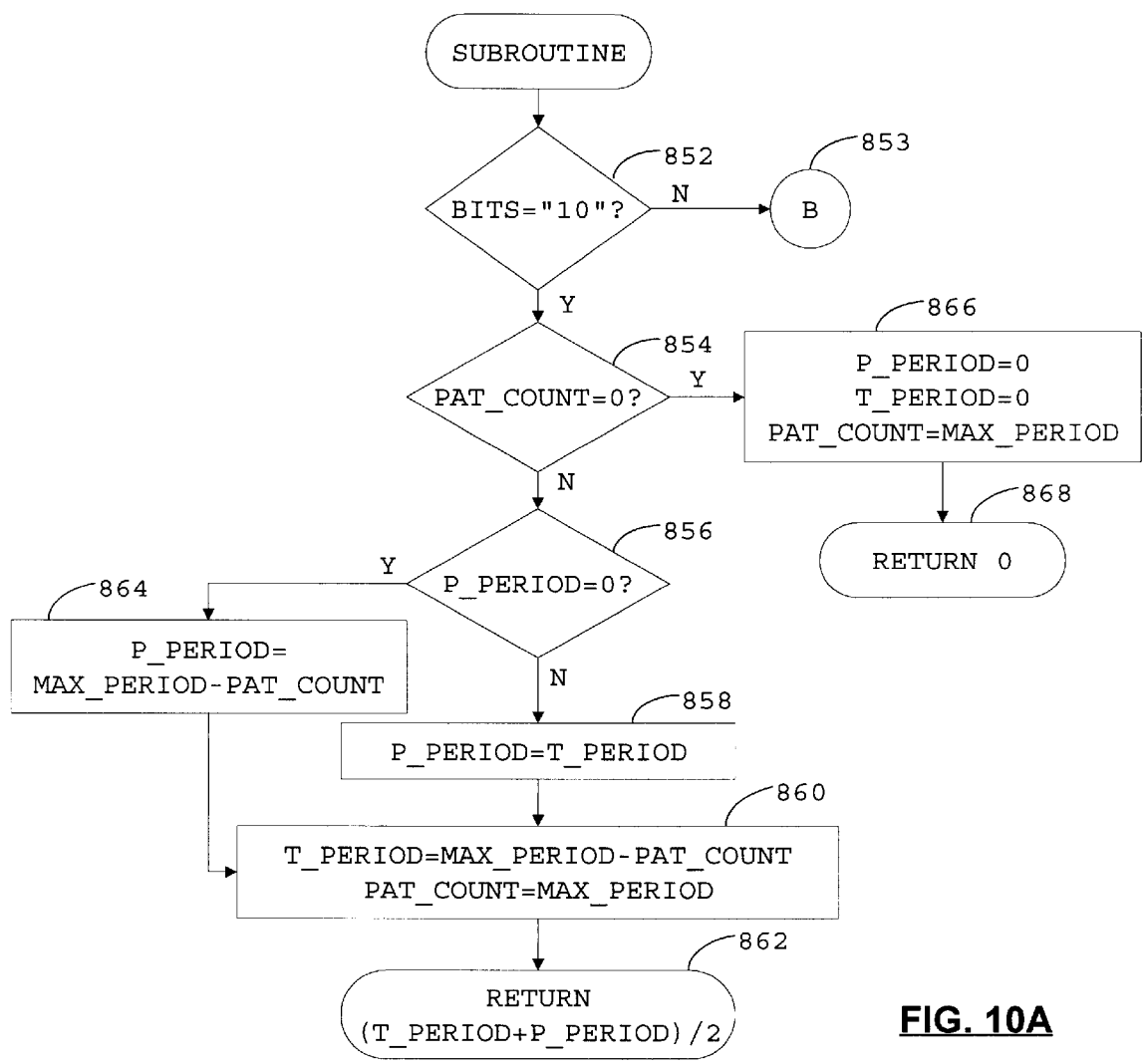
FIG. 10 is a flow diagram showing the logical operation of a subroutine as used in FIG. 9.
Figure 10B:
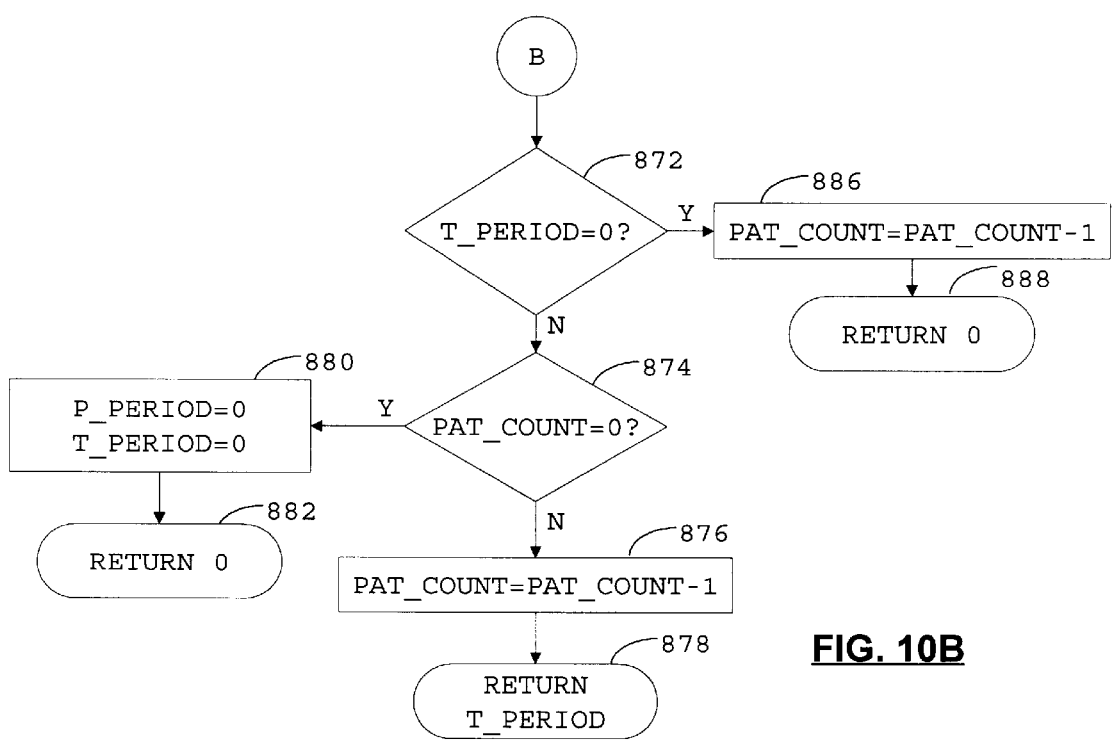

Referring next to FIG. 10 a flowchart showing the logical operation of the pattern detection subroutine is shown. As stated above, the two bits next to the bit being compressed are sent to this subroutine. From these two bits this subroutine determines whether the bit being compressed is part of a pattern. As part of the initialization of the compressor, several variables used by this subroutine are initialized. These variables include, for example, P_PERIOD (previous period), T_PERIOD (this-period), and PAT_COUNT (pattern count). These variables are different then the variables of the main routine. Additionally, these variables retain their values from subsequent calls to this routine.

First, the two bits are tested 852 to determine if they define an edge. In the preferred embodiment, a bit pattern of "10" indicates an edge. If an edge is detected, the variable PAT_COUNT is compared to zero 854. A PAT_COUNT of zero indicates that the previous edge detected was more than MAX_PERIOD bits away. Thus, the bit being compressed is not in a pattern. Under this condition, P_PERIOD and T_PERIOD are set to zero while PAT_COUNT is reset to MAX_PERIOD. In the preferred embodiment MAX_PERIOD is two time the cell size, which results in a MAX_PERIOD of 15.

If PAT_COUNT is other than zero, then the variable P_PERIOD is compared to zero 856. A P_PERIOD of zero indicates that the beginning of a pattern has been detected. P_PERIOD is first set to MAX_PERIOD-PAT_COUNT 864. As shown and described below, PAT_COUNT is decremented 886 each time this subroutine is called and an edge is not detected. Because PAT_COUNT starts at MAX_PERIOD, the number of bits processed since the last edge is equal to MAX_PERIOD—PAT_COUNT. Thus, in this branch, by definition, a new pattern has just been detected, therefore P_PERIOD contains the length of the period just detected. A P_PERIOD other than zero 856 indicates that the bit being compressed is part of an existing pattern, thus P_PERIOD is set to T_PERIOD where T_PERIOD holds the count of the past period.

Next, T_PERIOD is updated to hold the count of the present period by subtracting the PAT_COUNT from the MAX_PERIOD 860. After updating T_PERIOD, PAT_COUNT is reset to MAX_PERIOD 860.

Finally, the average of T_PERIOD and P_PERIOD is returned. Averaging forms a consistent pattern width calculation across an alternating pattern such as that in FIG. 6, which is common when the resolution is insufficient to render a specific shade of gray.

Referring back to block 852, if the two bits passed to the present subroutine are other than "10" then branch B 853 is taken. First, T_PERIOD is compared to zero 872. If T_PERIOD is equal to zero, then the bit being compressed is not inside a pattern. PAT_COUNT is decremented provided it is not already equal to zero 886. Because the bit is not in a pattern, a zero is returned to the calling routine 888.

If T_PERIOD is not equal to zero 872, then PAT_COUNT is compared to zero 874. A PAT_COUNT of zero indicates that there have been more than MAX_PERIOD bits since the last edge detection, thus this bit is no longer in a pattern. Both P_PERIOD and T_PERIOD are reset to zero 880 and a zero is returned to the calling routine 882. A PAT_COUNT other than zero indicates that the bit being compressed is still in a pattern. PAT_COUNT is decremented provided it is not already equal to zero 886 and T_PERIOD is returned 878.

Figure 11:
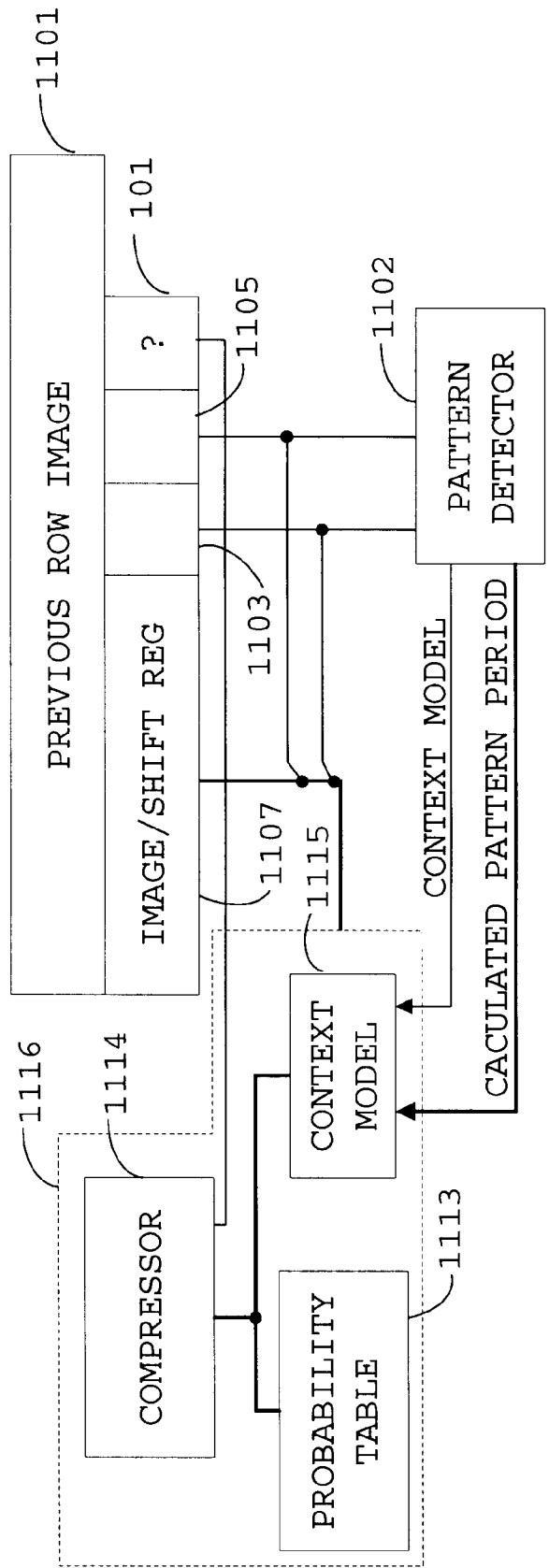
FIG. 11 is a high level block diagram of a hardware implementation in accordance with the present invention.

Referring next to FIG. 11 a block diagram of a hardware implementation of the preferred embodiment of the present invention will now be described. As bit 101 is being passed to the arithmetic compressor 1116, bits 1103 and 1105 are passed to a pattern detector 1102. Pattern detector 1102 detects patterns in the image. If a pattern is found, pattern detector 1102 instructs the context model 1115 to use the pattern context model and simultaneously outputs the calculated pattern period. The pattern context model uses the calculated pattern period to configure the context model to match the detected pattern. The compressor, along with the probability table 1113 and context model 1115 compresses bit 101. The compressed data is then written out, generally to a memory device not shown. Bit 1103 is shifted into the image/shift register 1107, bit 1105 is shifted into 1103, 101 is shifted into 1105, and a new bit from the image is shifted into 101.

Decompression is performed in generally the same mannor as compression. However, during decompression, the arithremitic compressor reads in the compressed data, using the probability table 1113 and context model 1115 decompresses and stores bit 101. As before, once bit 101 is decompressed the data in image/shift register 1107, bits 1103, 1105, and 101 are all shifted left. Data exiting image/shift register 1107 is stored, generally, in a memory device.

Pattern detector 1102 operates exactly as during compression to selected the proper context model.

Figure 12A:
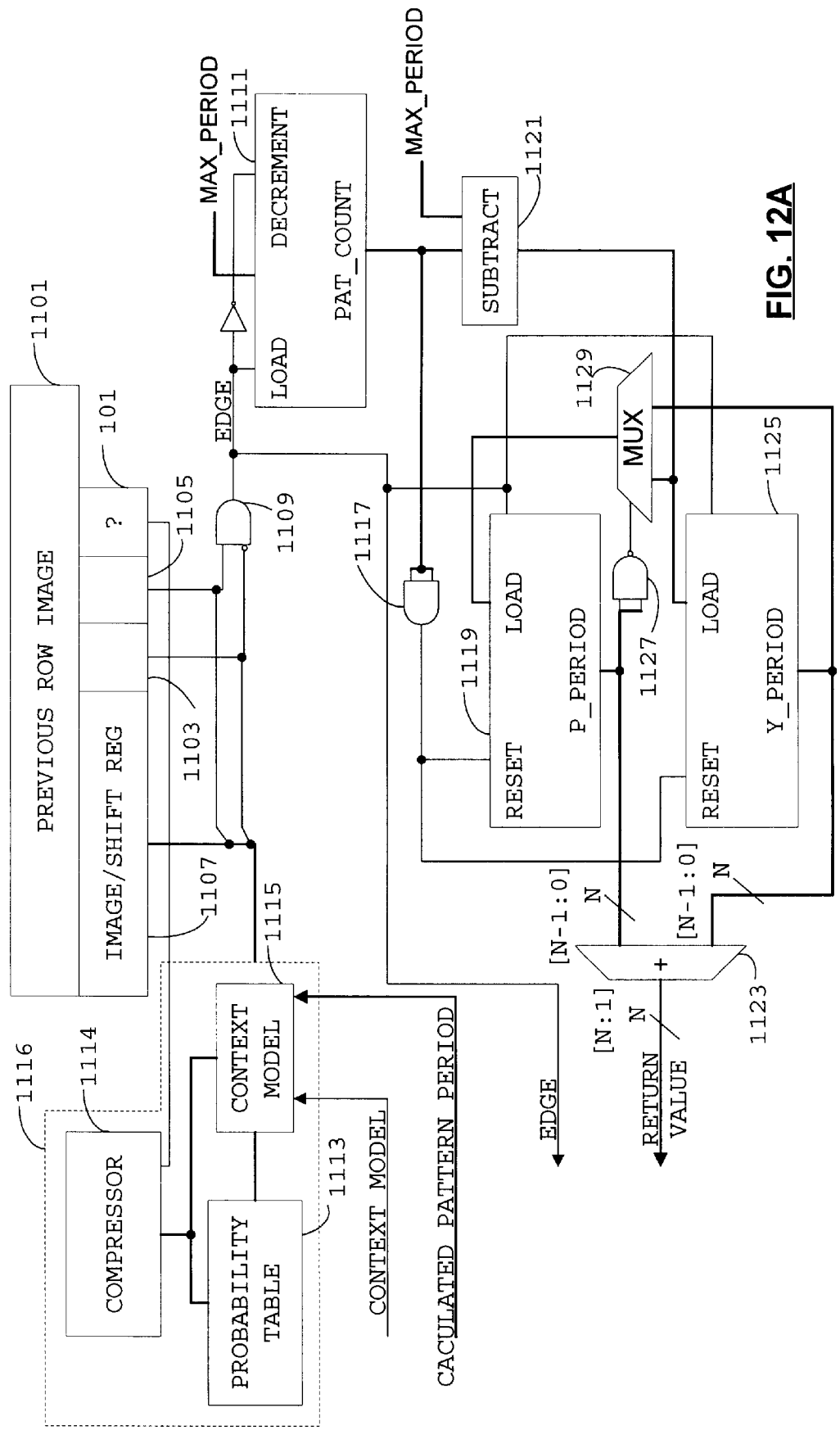
FIG. 12 is a more detailed, high level block diagram of a hardware implementation in accordance with the present invention.
Figure 12B:
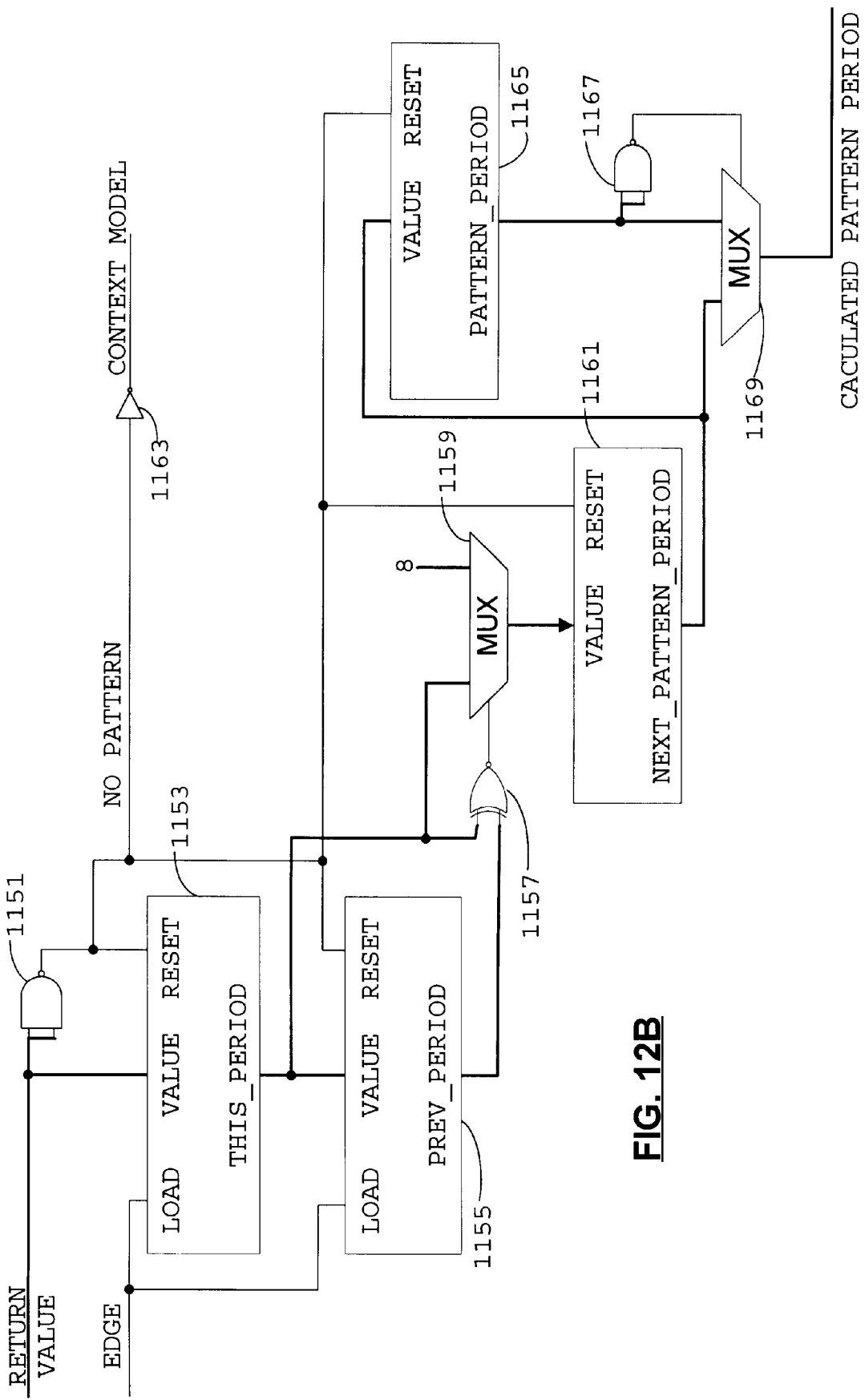

Referring now to FIG. 12, As bit 101 is being passed to the arithmetic compressor 1116, bits 1103 and 1105 are used to detect the existence of a pattern. Gate 1109 detects whether bits 1103 and 1105 define an edge. The output of gate 1109 (EDGE) causes several results. First, if EDGE is true and PAT_COUNT 1111 is zero then gate 1117 resets P_PERIOD 1119 and T_PERIOD 1125. The resetting of P_PERIOD 1119 and T_PERIOD 1125 coincides with step 866 in FIG. 10. If PAT_COUNT is not zero then the true EDGE signal from gate 1109 causes P_PERIOD 1119 and T_PERIOD 1125 to be loaded. T_PERIOD is loaded with output of subtraction block 1121, which is MAX_PERIOD-PAT_COUNT. P_PERIOD 1119 is loaded with the output of MUX 1129. MUX 1129 outputs T_PERIOD if gate 1127 detects that P_PERIOD 1119 is not zero. If P_PERIOD 1119 is zero then MUX 1129 outputs MAX_PERIODPAT_COUNT. Finally, a true EDGE reloads MAX_PERIOD into PAT_COUNT 1111. A summation block 1123 adds the P_PERIOD 1119 and T_PERIOD 1125. The least significant bit (LSB) of the output of summation block 1123 is dropped thereby dividing the sum by 2 to obtain the average RETURN_VALUE.

Figure 7:
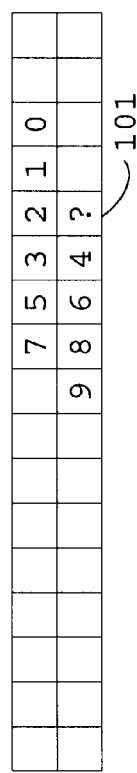
FIG. 7 shows the context model used to compress text and line art image data.

Gate 1151 determines if the RETURN_VALUE is zero thereby indicating no pattern present. The output of gate 1151 (NO_PATTERN) is inverted by gate 1163 to generate the CONTEXT_MODEL_MODE selection. Thus, if the output of gate 1163 is true, then a pattern context model, such as those in FIGS. 4 or 8, is used by compressor 1114 to compress bit 101. If the output of gate 1163 is false then a text/line art context model, such as FIGS. 3 or 7, is used to compress bit 101. A false output at gate 1151, which indicates no pattern, resets THIS_PERIOD 1153, PREV_PERIOD 1153, NEXT_PATTERN_PERIOD 1161 and PATTERN_PERIOD 1165.

Assuming that a pattern has been detected, thus a pattern context model is being used, the pattern width must next be determined. If an edge was detected, then PREV_PERIOD 1155 is loaded with THIS_PERIOD 1153 and THIS_PERIOD 1153 is loaded with the RETURN_VALUE from 1123. PATTERN_PERIOD 1165 is loaded with the NEXT_PATTERN_PERIOD 1161. NEXT_PATTERN_PERIOD 1161 is then loaded with the SEED value (eight) if gate 1157 determines that THIS_PERIOD 1153 and PREV_PERIOD 1153 are not equal. However, if THIS_PERIOD 1153 and PREV_PERIOD 1153 are equal gate 1157 causes MUX 1159 to select THIS_PERIOD 1153 to load into NEXT_PATTERN_PERIOD 1161.

MUX 1169 outputs NEXT_PATTERN_PERIOD 1161 if PATTERN_PERIOD 1165 is zero as determined by gate 1167. In the alternative, MUX 1169 outputs PATTERN_PERIOD 1165 if PATTERN_PERIOD is not zero. The output of MUX 1169, CALCULATED_PATTERN_PERIOD is used by CONTEXT MODEL 1115 as the pattern width 801 in FIG. 8 for example.

With the proper context model selected, COMPRESSOR 1114 with the aid of PROBABILITY TABLE 1113, compresses bit 101.

Realizing that images are composed of all text/line art, others contain almost entirely pattern data, and a third class that contains a mixture of both, ideally the PROBABILITY TABLE 1113 should be partitioned into a text/line art section and a pattern section. However, for many designs this is not possible because it would double the size of the memory used to store the probability table. In the preferred embodiment, there is a single probability table of a given size. This preferred embodiment handles all three cases by tending to select one set of addresses for text/line art data while tending to select a different set of addresses for pattern data.

The preferred embodiment groups the text/line art addresses such that a particular address line is likely to have the value of its neighbor while the pattern address bits will tend to have different values. Using the text/line art context model as shown in FIG. 7, address bit 3, for example, is likely to be a one if address bits 2, 4, and/or 5 are a one. However, in using the pattern addressing context model as shown in FIG. 8, the value of address bit 3 is not associated with address bits 2, 4, or 5. Therefore, certain addresses are likely in the text and line art case that aren't likely in the pattern case. This effectively allows use of the entire probability table for both text/line art images as well as pattern images. There is some decrease in the compression ratio by sharing versus having two probability tables. The decrease in the compression ratio is not significant compared to cutting the probability table in half and using one half for text/line art while using the other half for pattern data.

Although the preferred embodiment of the invention has been illustrated, and that form described, it is readily apparent to those skilled in the art that various modifications may be made therein without departing from the spirit of the invention or from the scope of the appended claims.

What is claimed is:

1. A method for compressing an image data, said method comprising the steps of:

detecting a pattern in a first subset of said image data, where said first subset being collocated to a second subset;

if said step of detecting detects an absence of said pattern then first selecting a selected context model to be a text mode context model;

if said step of detecting detects said pattern then:
      determining a period of said pattern; and
      second selecting said selected context model to be a pattern mode context model where said pattern mode context model having a width directly related to said period of said pattern; and arithmetic compressing said second subset using said selected context model.

2. The method of claim 1 wherein said step of detecting further comprising the steps of:

first checking if said first subset defines a present edge;

if said step of first checking determines that said first subset defines said present edge then:
      finding said absence of said pattern if said present edge is more than MAX_PERIOD from a previous edge;
      setting a previous period value equal to a seed value if said previous period value is undefined, in the alternative, setting said previous period value to a present pattern value;
      first making said present pattern value equal to a present pattern width; and
      second making said period of said pattern being equal to an average of said present pattern value and said previous period value.

3. The method of claim 2 further comprising the steps of:

if said step of first checking determines that said first subset fails to define said present edge then:
      if said present pattern value indicates that said second subset is outside of said pattern, decrementing a count value;
      indicating said absent of said pattern if said count value is zero; and
      if said count value is other than zero then, decrementing said count value and third making said present pattern value equal to a present pattern width.

4. A method for decompressing a data, said method comprising the steps of:

detecting a pattern in a first subset of said data, where said first subset being collocated to a second subset;

if said step of detecting detects an absence of said pattern then first selecting a selected context model to be a text mode context model;

if said step of detecting detects said pattern then:
      determining a period of said pattern; and
      second selecting said selected context model to be a pattern mode context model where said pattern mode context model having a width directly related to said period of said pattern; and arithmetic decompressing said second subset using said selected context model.

5. The method of claim 4 wherein said step of detecting further comprising the steps of:

first checking if said first subset defines a present edge;

if said step of first checking determines that said first subset defines said present edge then:
      finding said absence of said pattern if said present edge is more than MAX_PERIOD from a previous edge;
      setting a previous period value equal to a seed value if said previous period value is undefined, in the alternative, setting said previous period value to a present pattern value;
      first making said present pattern value equal to a present pattern width; and
      second making said period of said pattern being equal to an average of said present pattern value and said previous period value.

6. The method of claim 5 further comprising the steps of:

if said step of first checking determines that said first subset fails to define said present edge then:
      if said present pattern value indicates that said second subset is outside of said pattern, decrementing a count value;
      indicating said absent of said pattern if said count value is zero; and
      if said count value is other than zero then, decrementing said count value and third making said present pattern value equal to a present pattern width.

7. An apparatus for compressing an image data, said apparatus comprising:

an arithmetic compressor, said arithmetic compressor comprising:
      a probability table;
      a first context model being optimized for halftoned images; and
      a second context model being optimized for text and line art images;

a shift register connected to said arithmetic compressor, said shift register arranged to receive said image data;

a pattern detector connected to said arithmetic compressor, said pattern detector signaling said arithmetic compressor to use said first context model when a pattern is detected in said image data, in the alternative, said arithmetic compressor using said second context model.

8. The apparatus of claim 7 wherein said pattern detector further comprising:

a pattern width detector connected to said arithmetic compressor; and said first context model configuring in response to receiving information from said pattern width detector.

9. The apparatus of claim 7 wherein:

said first context model mapping contents of said shift register into a first portion of said probability table; and said second context model mapping contents of said shift register into a second portion of said probability table.

* * * * *